(12) United States Patent
Wu

(10) Patent No.: US 7,561,470 B2
(45) Date of Patent: Jul. 14, 2009

(54) DOUBLE-SIDE-BIAS METHODS OF PROGRAMMING AND ERASING A VIRTUAL GROUND ARRAY MEMORY

(75) Inventor: Chao-I Wu, Zhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/614,742

(22) Filed: Dec. 21, 2006

(65) Prior Publication Data

US 2008/0151642 A1    Jun. 26, 2008

(51) Int. Cl.
    *G11C 16/04* (2006.01)
(52) U.S. Cl. .......................... 365/185.18; 365/185.28; 365/185.22
(58) Field of Classification Search ............ 365/185.18, 365/185.28, 185.22
    See application file for complete search history.

(56) References Cited

U.S. PATENT DOCUMENTS

| 5,838,618 | A  | * | 11/1998 | Lee et al. ................ 365/185.29 |
| 5,856,943 | A  | * | 1/1999  | Jeng ...................... 365/185.14 |
| 5,962,890 | A  | * | 10/1999 | Sato ......................... 257/320 |
| 6,011,725 | A  |   | 1/2000  | Eitan |
| 6,690,601 | B2 | * | 2/2004  | Yeh et al. ................ 365/185.28 |
| 6,744,675 | B1 | * | 6/2004  | Zheng et al. ............ 365/185.28 |
| 7,016,225 | B2 | * | 3/2006  | Roizin et al. ............ 365/185.03 |
| 7,075,143 | B2 | * | 7/2006  | Fujiwara et al. ............. 257/324 |
| 7,092,298 | B2 | * | 8/2006  | Kim et al. ............... 365/185.29 |

OTHER PUBLICATIONS

Ito, F., et al., "A Novel MNOS Technology Using Gate Hole Injection in Erase Operation for Embedded Nonvolatile Memory Applications," 2004 Symposium on VLSI Tech Digest of Tech Papers 2004, 2 pages.
Yeh, C.C., et al., "Phines: A Novel Low Power Program/Erase, Small Pitch, 2-Bit per Cell Flash Memory," IEDM 931 (2002) 4 pages.

* cited by examiner

*Primary Examiner*—Connie C Yoha
(74) *Attorney, Agent, or Firm*—Haynes Beffel & Wolfeld LLP

(57) ABSTRACT

The present invention provides a method for applying a double-side-bias operation to a virtual ground array memory composed of a matrix of N-bit memory cells. In a first embodiment, the virtual ground array is programmed by a double-side-bias method which applies the same or similar biasing voltage simultaneously on the source region and drain region of a selected charge trapping memory cell so that the left bit and the right bit of the selected charge trapping memory cell are programmed together. In a second embodiment, the virtual ground array is erased by a double-side-bias method which applies the same or similar biasing voltage simultaneously on source regions and regions of a plurality of charge trapping memory cells in the virtual ground array so that the left bit and the right bit of each charge trapping memory cell are erased together.

10 Claims, 7 Drawing Sheets

DOUBLE-SIDE-BIAS METHODS OF PROGRAMMING AND ERASING A VIRTUAL GROUND ARRAY MEMORY

BACKGROUND OF THE INVENTION

1. Field of the Invention

The present invention relates generally to electrically programmable and erasable memory and more particularly to programming and erasing of a charge trapping memory array.

2. Description of Related Art

Electrically programmable and erasable nonvolatile memory technologies based on charge storage structures known as Electrically Erasable Programmable Read-Only Memory (EEPROM) and flash memory are used in a variety of modern applications. A flash memory is designed with an array of memory cells that can be independently programmed and read. Sense amplifiers in a flash memory are used to determine the data value or values stored in a nonvolatile memory. In a typical sensing scheme, an electrical current through the memory cell being sensed is compared to a reference current by a current sense amplifier.

A number of memory cell structures are used for EEPROM and flash memory. As the dimensions of integrated circuits shrink, greater interest is arising for memory cell structures based on charge trapping dielectric layers, because of the scalability and simplicity of the manufacturing processes. Memory cell structures based on charge trapping dielectric layers include structures known by N-bit memory. These memory cell structures store data by trapping charge in a charge trapping dielectric layer, such as silicon nitride. As negative charge is trapped, the threshold voltage of the memory cell increases. The threshold voltage of the memory cell is reduced by removing negative charge from the charge trapping layer.

N-bit devices use a relatively thick bottom oxide, e.g. greater than 3 nanometers, and typically about 5 to 9 nanometers, to prevent charge loss. Instead of direct tunneling, band-to-band tunneling induced hot hole injection BTBTHH can be used to erase the cell. However, the hot hole injection causes oxide damage, leading to charge loss in the high threshold cell and charge gain in the low threshold cell Moreover, the erase time must be increased gradually during program and erase cycling due to the hard-to-erase accumulation of charge in the charge trapping structure. This accumulation of charge occurs because the hole injection point and electron injection point do not coincide with each other, and some electrons remain after the erase pulse. In addition, during the sector erase of an N-bit flash memory device, the erase speed for each cell is different because of process variations (such as channel length variation). This difference in erase speed results in a large Vt distribution of the erase state, where some of the cells become hard to erase and some of them are over-erased. Thus the target threshold Vt window is closed after many program and erase cycles and poor endurance is observed. This phenomenon will become more serious as the technology continues scaling down.

A traditional floating gate device stores 1 bit of charge in a conductive floating gate. N-bit devices have a plurality of cells where each N-bit cell provides two bits of flash cells that store charge in an Oxide-Nitride-Oxide (ONO) dielectric. In a typical structure of an N-bit memory cell, a nitride layer is used as a trapping material positioned between a top oxide layer and a bottom oxide layer. The ONO layer structure effectively replaces the gate dielectric in floating gate devices. The charge in the ONO dielectric with a nitrite layer may be either trapped on the left side or the right side of an N-bit cell.

Conventional program and erase techniques employ a channel hot electron method for programming and a band-to-band tunneling induced hot hole method for erasing. It is desirable to provide more efficient methods for programming and erasing non-volatile memory.

SUMMARY OF THE INVENTION

The present invention describes methods for applying a double-side-bias (DSB) operation to a virtual ground array memory composed of a matrix of N-bit memory cells. In a first embodiment, the virtual ground array is programmed by a double-side-bias method which applies the same or similar biasing voltages simultaneously on the source region and drain region of a selected charge trapping memory cell so that the left bit and the right bit of the selected charge trapping memory cell are programmed together. A negative gate voltage, $-Vg$, is applied to a gate terminal of the selected charge trapping memory cell to enhance the hole injection efficiency.

In a second embodiment, the virtual ground array is erased by a double-side-bias method which applies the same or similar biasing voltages simultaneously to source regions and regions of a plurality of charge trapping memory cells in the virtual ground array so that the left bit and the right bit for each charge trapping memory cell are erased together. The double-side-bias methods in the first and second embodiments emulate plus and minus Fowler-Nordheim operations with lower bias voltages. A positive gate voltage, $+Vg$, is applied to a gate terminal of the selected charge trapping memory cell to enhance the electron injection efficiency.

Broadly stated, a method for double side biasing a virtual ground array memory device having a plurality of charge trapping memory cells, the plurality of charge trapping memory cells having respective source and drain terminals, each charge trapping memory cell having N-bits, comprises programming a charge trapping memory cell in the plurality of charge trapping memory cells by a programming technique, the charge trapping memory cell having a gate terminal, a source terminal and a drain terminal, the charge trapping memory cell having one or more charge trapping sites; and erasing N-bits in the plurality of charge trapping memory cells by biasing simultaneously the source terminals with a first voltage and drain terminals with a second voltage in the plurality of charge trapping memory cells with about a same voltage value.

The double-side-bias erase operation can increase the erase efficiency on the virtual ground array. The double-side-bias erase operation can also be used to obtain a sector erase on the virtual ground array. The double-side-bias method in the present invention can further be used to replace the BTBHH erase method for increasing N-bit erase efficiency on a virtual ground array.

The structures and methods of the present invention are disclosed in the detailed description below. This summary does not purport to define the invention. The invention is defined by the claims. These and other embodiments, features, aspects, and advantages of the invention will become better understood when read in conjunction with the following description, appended claims and accompanying drawings.

BRIEF DESCRIPTION OF THE DRAWINGS

The invention will be described with respect to specific embodiments thereof and reference will be made to the drawings, in which.

DETAILED DESCRIPTION

Figure 1:
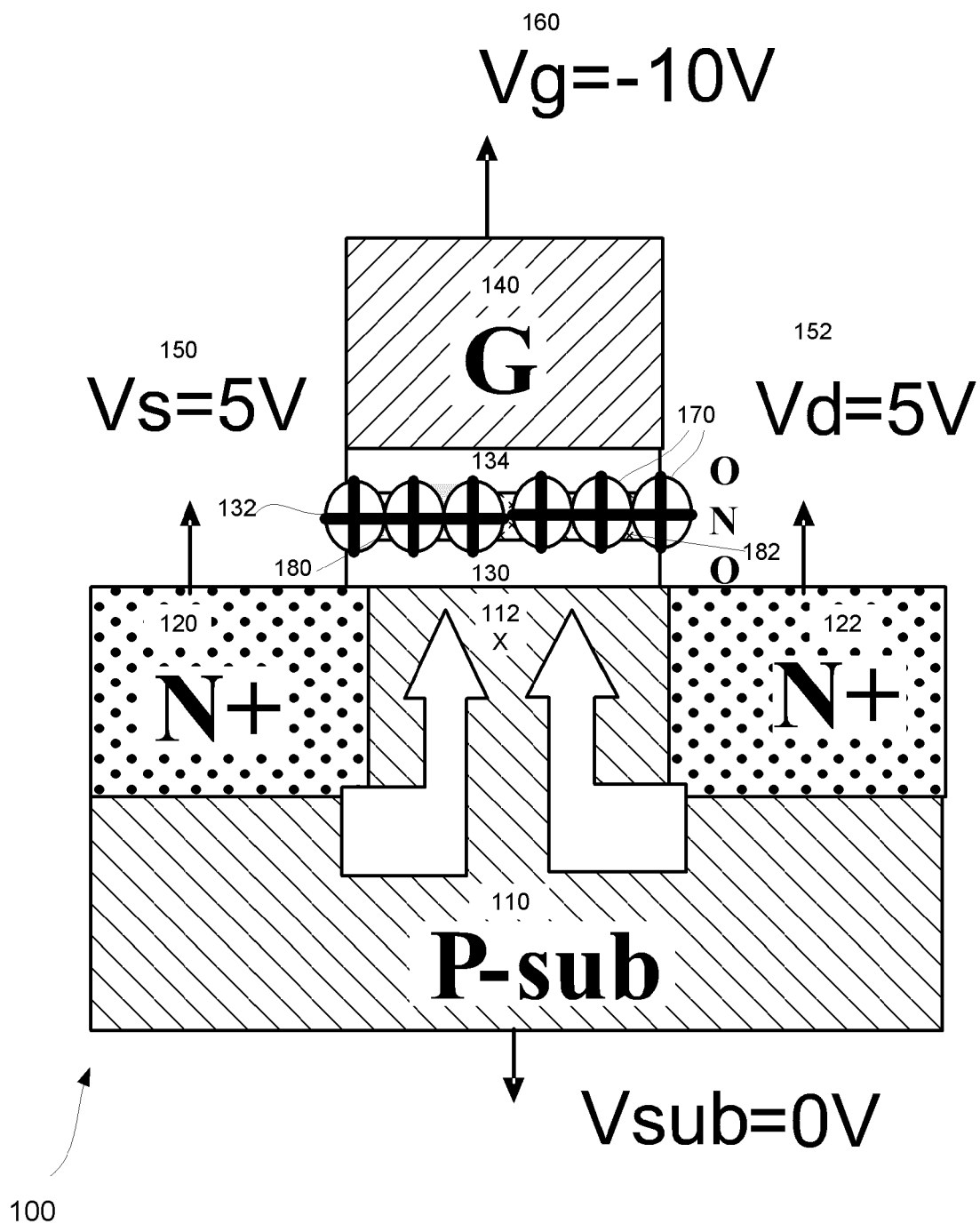
FIG. 1 is a process diagram illustrating a cross-sectional virtual ground array memory that is erased by employing a double-side-bias hole-injection method in accordance with the present invention.

A description of structural embodiments and methods of the present invention is provided with reference to FIGS. 1-7. It is to be understood that there is no intention to limit the invention to the specifically disclosed embodiments, but that the invention may be practiced using other features, elements, methods and embodiments. Like elements in various embodiments are commonly referred to with like reference numerals.

FIG. 1 is a process diagram illustrating a cross-sectional view of erasing a charge trapping memory cell (or N-bit) 100 by using a double-side-bias (DSB) hole-injection (HI) method. The charge trapping memory cell 100 comprises a p-substrate 110 with n+ doped regions 120 and 122, and a p-doped region between the n+ doped regions 120 and 122. A channel width X 112 of the p-substrate 110 is positioned between the n+ doped region 120 on the left end and the n+ doped region 122 on the right end. A bottom dielectric structure 130 (bottom oxide) overlays a top surface of the channel width X 112 of the p-substrate 110. A charge trapping structure 132 (e.g. silicon nitride layer) overlays the bottom dielectric structure 130. A top dielectric structure (top oxide) 134 overlays the charge trapping structure 132. A polygate 140 overlays the top dielectric structure 134. The combination of the bottom dielectric structure 130, the charge trapping structure 132, and the top dielectric structure 134 is commonly referred as an ONO (oxide-nitride-oxide) structure. The width of the ONO structure, typically but not necessarily, aligns with the channel width X 112 of the p-substrate 110. The charge trapping memory cell 100 comprises a first charge trapping site 180 in the charge trapping structure 132, such as on the left side of the charge trapping structure 132 for storing one or more bits, and a second charge trapping site 182 in the charge trapping structure 132, such as on the right side of the charge trapping structure 132 for storing one or more bits. Representative top dielectrics include silicon dioxide and silicon oxynitride, or other similar high dielectric constant materials including for example $Al_2O_3$, having a thickness of about 5 to 10 nanometers. Representative bottom dielectrics include silicon dioxide and silicon oxynitride, or other similar high dielectric constant materials, having a thickness of about 3 to 10 nanometers. Representative charge trapping structures include silicon nitride, or other similar high dielectric constant materials, including metal oxides such as $Al_2O_3$, $HfO_2$, $CeO_2$, and others, having a thickness of about 3 to 9 nanometers. The charge trapping structure may be a discontinuous set of pockets or particles of charge trapping material, or a continuous layer as shown in the drawing.

The memory cell for N-bit-like cells has, for example, a bottom oxide with a thickness ranging from 3 nanometers to 10 nanometers, a charge trapping layer with a thickness ranging from 3 nanometers to 9 nanometers, and a top oxide with a thickness ranging from 5 nanometers to 10 nanometers. The memory cell for SONOS-like cells has, for example, a bottom oxide with a thickness ranging from 1 nanometer to 3 nanometers, a charge trapping layer with a thickness ranging from 3 nanometers to 9 nanometers, and a top oxide with a thickness ranging from 3 nanometers to 10 nanometers.

As generally used herein, programming refers to raising the threshold voltage of a memory cell and erasing refers to lowering the threshold voltage of a memory cell. However, the invention encompasses both products and methods where programming refers to raising the threshold voltage of a memory cell and erasing refers to lowering the threshold voltage of a memory cell, and products and methods where programming refers to lowering the threshold voltage of a memory cell and erase refers to raising the threshold voltage of a memory cell.

The charge trapping cell 100 is double-side-biased in the n+ doped regions 120 and 122, which can also be referred to as the source region 120 and the drain region 122. The term "double-side-bias" refers to biasing the source region 120 and the drain region 122 simultaneously. The term "simultaneously" as used in this application is to be interpreted broadly, including operating at the same time, overlapping, concurrent, in parallel, or around the same time. The bias voltage applied to the source region 120 and the drain region 122 can be the same voltage or a different voltage. In this embodiment, the same voltage of 5 volts is applied to the source region 120 and the drain region 122, which shows that a source voltage Vs 150 of 5 volts is applied to the source region 120 and a drain voltage Vd 152 of 5 volts is applied to the drain region 122.

A negative gate voltage −Vg 160 is applied to the polygate 140 in a double-side-bias hole-injection method. In this embodiment, the negative gate voltage −Vg 160 of −10 volts is applied to the polygate 140 to enhance the hole injection efficiency. Hole charges 170 can be generated with a junction voltage, which is used to control hole generation efficiency.

Figure 2:
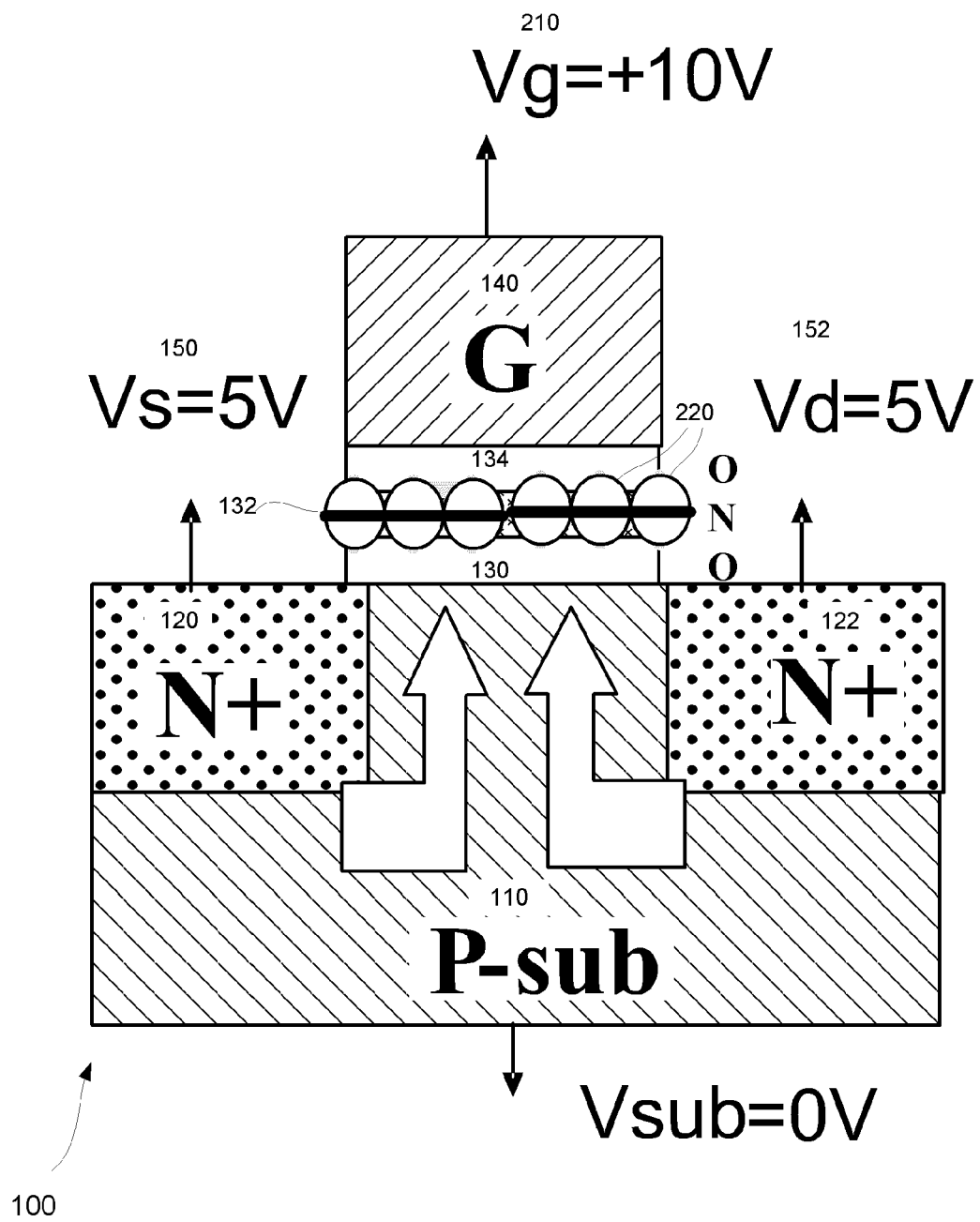
FIG. 2 is a process diagram illustrating a cross-sectional view of a virtual ground array memory that is programmed by employing a double-side-bias electron-injection method in accordance with the present invention

FIG. 2 is a process diagram illustrating a cross-sectional view in programming the nitride trapping memory cell 100 by using a double-side-bias electron-injection (EI) method. The nitride trapping cell 100 in FIG. 2 is also applied with the double-side-bias by applying the same voltages to the source region 120 and the drain region 122. The source voltage Vs 150 of 5 volts is applied to the source region 120. The drain voltage Vd 152 of 5 volts is applied to the drain region 122. In an electron-injection method, a positive gate voltage +Vg 210 of +10 volts is applied to the polygate 140 to enhance the electron injection efficiency. Electron charges 220 can be generated with a junction voltage, which is used to control electron generation efficiency.

Figure 3:
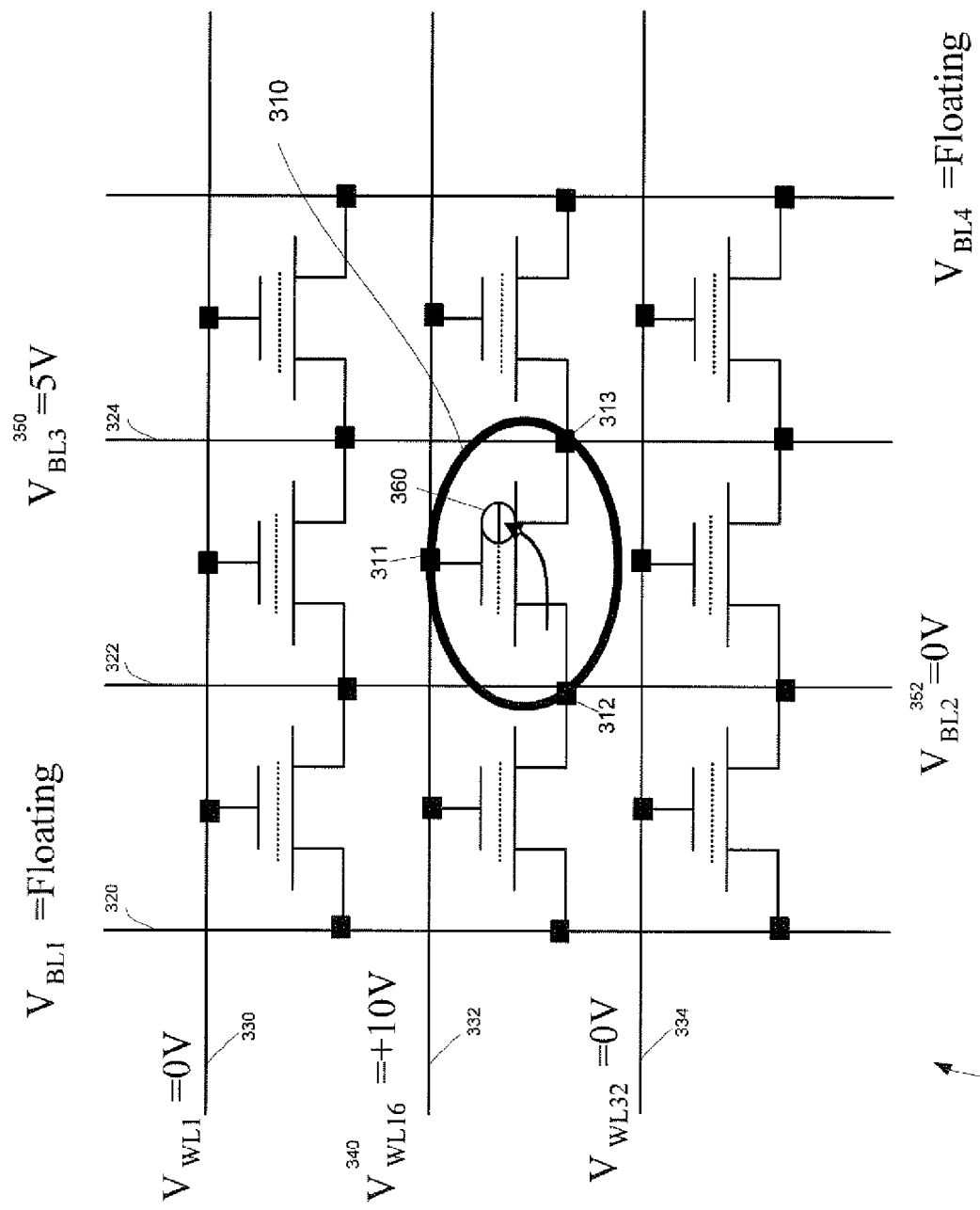
FIG. 3 is a circuit diagram illustrating a channel hot electron program on a right bit of a virtual ground memory in accordance with the present invention.

FIG. 3 is a simplified circuit diagram illustrating the programming of the right bit of an N-bit memory cell 310 in a virtual ground array memory device 300 by channel hot electron (CHE) programming. The virtual ground array memory device 300 comprises a plurality of bit lines and a plurality of word lines. The plurality of bit lines, including a first bit line 320, a second bit line 322 and a third bit line 324 extend vertically to intersect with a plurality of word lines, including a first word line 330, a second word line 332 and a third word line 334. In this illustration, the N-bit memory cell 310 is selected for channel hot electron programming. The N-bit memory cell 310 includes a gate terminal 311, a source terminal 312 and a drain terminal 313.

One characteristic of the virtual ground array 300 is that there is a voltage differential between a source voltage applied to the source terminal 312 and a drain voltage applied to the drain terminal 313. A positive word line voltage, $V_{WL16}$ 340, of 10 volts is applied to the gate terminal 311 of the N-bit memory cell 310. The voltage for the third bit line 324, $V_{BL3}$ 350, is applied with a positive 5 volts to the drain terminal 313 of the N-bit memory cell 310. The voltage for the second bit line 322, $V_{BL2}$ 352, is applied with zero volts to the source terminal 312, thereby creating a voltage differential of 5 volts between the source terminal 312 and the drain terminal 313. Electron charges 360 are injected into the right side of the N-bit memory cell 310 due to the greater voltage value of the drain voltage at the drain terminal 313 relative to the source voltage at the source terminal 312. The right side of the N-bit memory cell 310 is programmed to a high voltage threshold Vt mode with electron charges 360.

Figure 4:
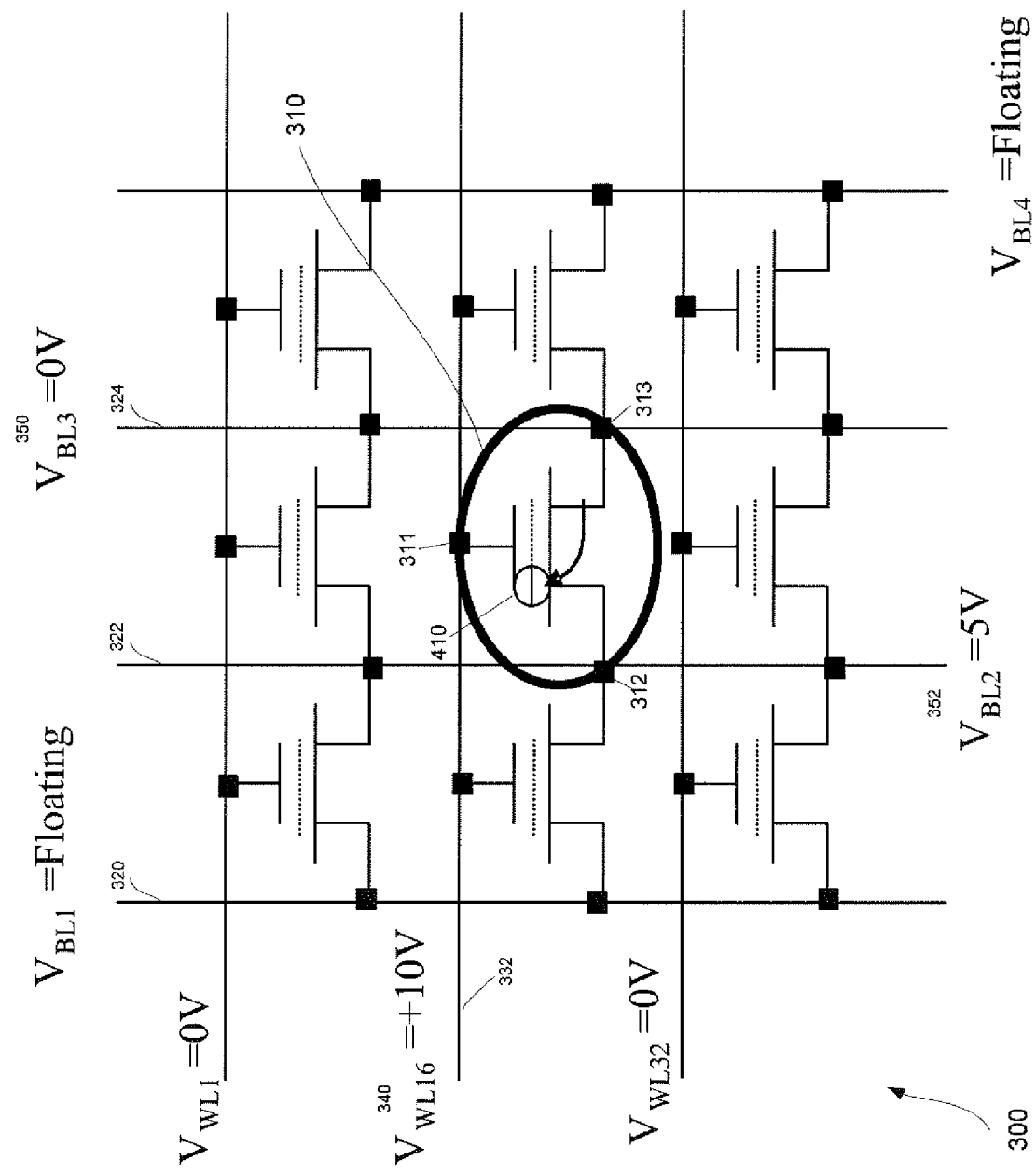
FIG. 4 is a circuit diagram illustrating a channel hot electron program on a left bit of the virtual ground memory in accordance with the present invention.

FIG. 4 is a simplified circuit diagram illustrating the programming of the left bit of the N-bit memory cell 310 in the virtual ground array memory device 300 by channel hot electron programming. The voltage differential between the source voltage at the source terminal 312 and the drain voltage at the drain terminal 313 in FIG. 4 is opposite from FIG. 3 because electron charges 410 are injected into the left side, rather than the right side, of the N-bit memory cell 310. In this illustration, the second bit line voltage $V_{BL2}$ 352 is applied with 5 volts to the second bit line 322 in charging the source terminal 312 of the N-bit memory cell 310. The third bit line voltage 350, is applied with zero volts to the third bit line 324, which is connected to the drain terminal 313 of the N-bit memory cell 310. The gate voltage applied to the gate terminal 311 remains the same at 10 volts, as supplied from the $V_{WL16}$ 340.

Figure 5:
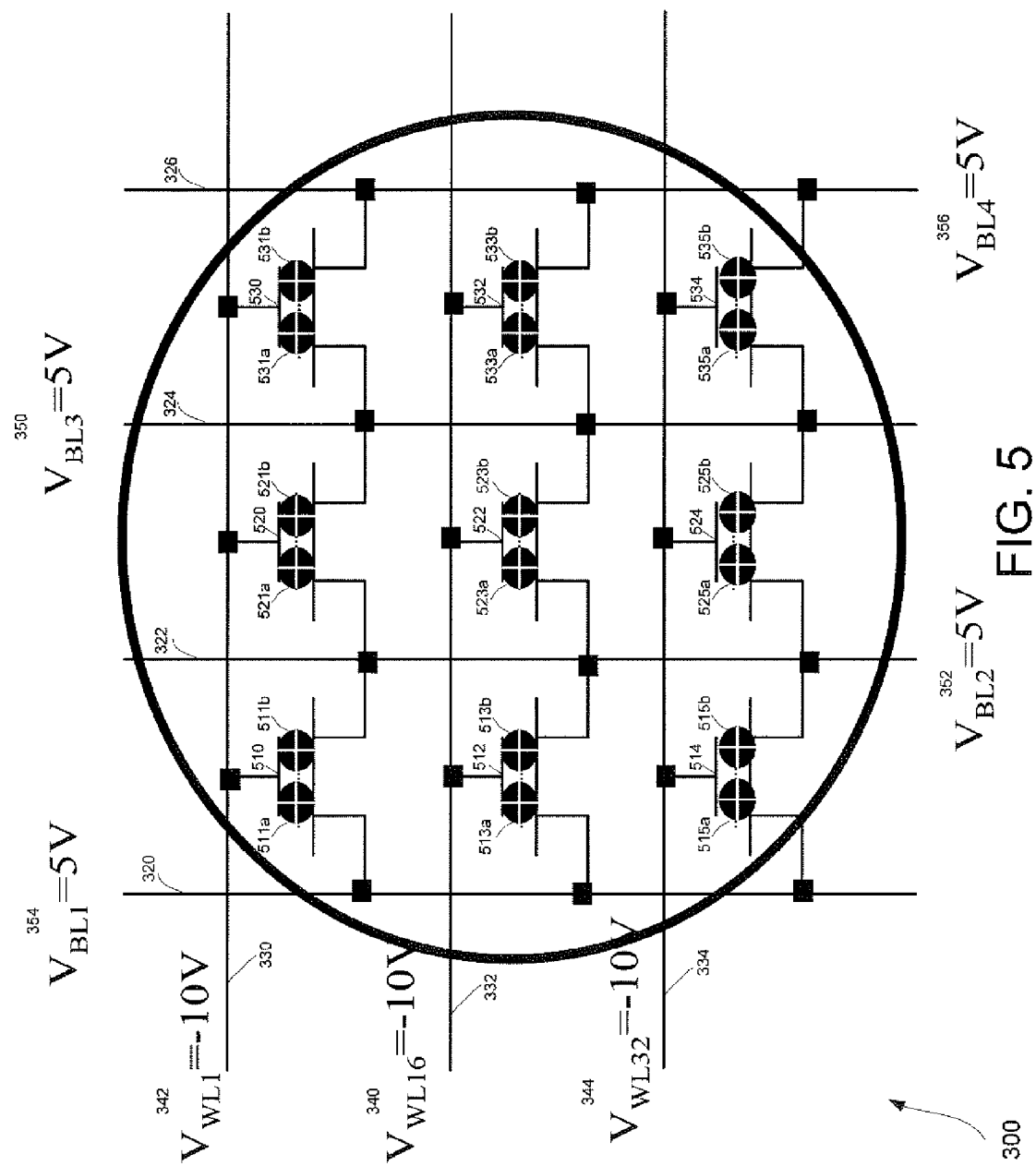
FIG. 5 is a circuit diagram illustrating conducting an erase operation of the virtual ground memory array by a double-side-bias hole-injection method in accordance with the present invention.

FIG. 5 is a simplified circuit diagram illustrating conducting an erase operation of the virtual ground memory array 300 by a double-side-bias hole-injection method. The virtual ground array 300 comprises a matrix of N-bit memory cells 510, 512, 514, 420, 522, 524, 530, 532 and 534. The source terminals of the N-bit memory cells 510, 512 and 514 are connected to the first bit line 320 and their drain terminals are connected to the second bit line 322. The source terminals of the N-bit memory cells 520, 522 and 524 are connected to the second bit line 322 and their drain terminals are connected to the third bit line 324. The source terminals of the N-bit memory cells 530, 532 and 534 are connected to the third bit line 324 and their drain terminals are connected to the fourth bit line 326. The first word line 330 is connected to the respective gate terminal of each N-bit memory cell 510, 520 and 530. The second word line 332 is connected to the respective gate terminal of each N-bit memory cell 512, 522 and 532. The third word line 334 is connected to the respective gate terminal of each N-bit memory cell 514, 524 and 534.

The erasing of the virtual ground memory array 300 by a double-side-bias hole-injection method involves applying a bias voltage to a source terminal and a drain terminal of an N-bit memory cell simultaneously or at about the same time. A negative gate voltage is applied to a gate terminal of the N-bit memory cell. All of the N-bit memory cells 510, 512, 514, 520, 522, 524, 530, 532 and 534 are erased simultaneously or about the same time in the virtual ground array 300. For N-bit memory cells 510, 512 and 514, the first bit line voltage $V_{BL1}$ 354 supplies 5 volts to the first bit line 320 and the second bit line voltage $V_{BL2}$ 352 supplies 5 volts to the second bit line 322, which erases both the right side and the left side of each of the N-bit memory cells 510, 512 and 514, as shown by hole charges 511a, 511b to the left side and the right side of the N-bit memory cell 510, hole charges 513a, 513b to the left side and the right side of the N-bit memory cell 512, and hole charges 515a, 515b to the left side and the right side of the N-bit memory cell 514. The first word line voltage $V_{WL1}$ 342, the second word line voltage $V_{WL16}$ 340 and the third word line voltage $V_{WL32}$ 344, supply respective negative voltages of −10 volts to each gate terminal of the N-bit memory cells 510, 512 and 514.

For N-bit memory cells 520, 522 and 524, the second bit line voltage $V_{BL2}$ 352 supplies 5 volts to the second bit line 322, and the third bit line voltage $V_{BL3}$ 350 supplies 5 volts to the third bit line 324, which erases both the right side and the left side of each of the N-bit memory cells 520, 522 and 524, as shown by hole charges 521a, 521b to the left side and the right side of the N-bit memory cell 520, hole charges 523a, 523b to the left side and the right side of the N-bit memory cell 522, and hole charges 525a, 525b to the left side and the right side of the N-bit memory cell 524. The first word line voltage $V_{WL1}$ 342, the second word line voltage $V_{WL16}$ 340 and the third word line voltage $V_{WL32}$ 344, supply respective negative voltages of −10 volts to each gate terminal of the N-bit memory cells 520, 522 and 524.

For N-bit memory cells 530, 532 and 534, the third bit line voltage $V_{BL3}$ 350 supplies 5 volts to the third bit line 324 and a fourth bit line voltage $V_{BL4}$ 356 supplies 5 volts to a fourth bit line 326, which erases both the right side and the left side of each of the N-bit memory cells 530, 532 and 534, as shown by hole charges 531a, 531b to the left side and the right side of the N-bit memory cell 530, hole charges 533a, 533b to the left side and the right side of the N-bit memory cell 532, and hole charges 535a, 535b to the left side and the right side of the N-bit memory cell 534. The first word line voltage $V_{WL1}$ 342, the second word line voltage $V_{WL16}$ 340 and the third word line voltage $V_{WL32}$ 344, supply respective negative voltages of −10 volts to each gate terminal of the N-bit memory cells 530, 532 and 534.

Figure 6:
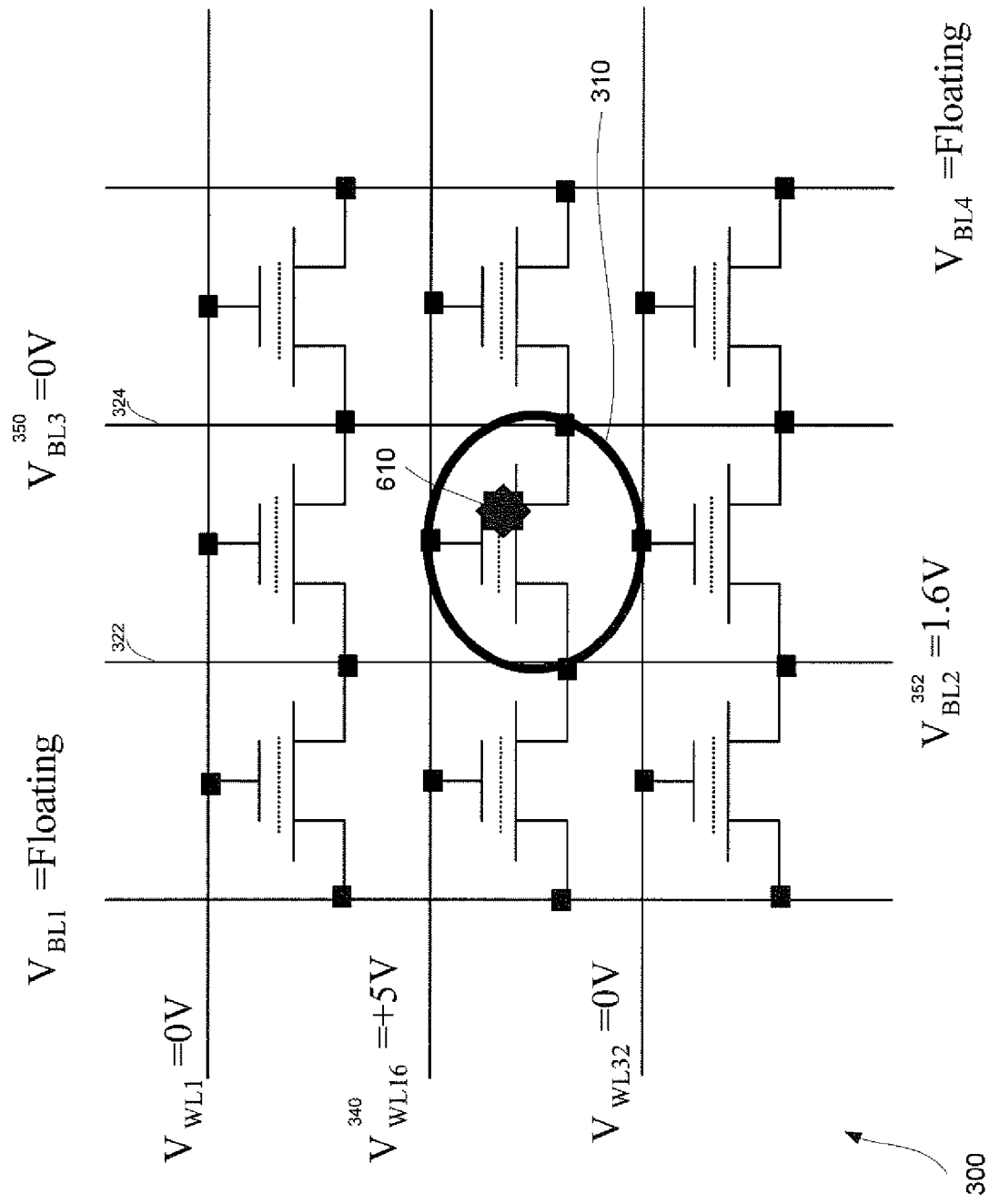
FIG. 6 is a circuit diagram illustrating the reading of a right bit of a selected memory cell in the virtual ground memory in accordance with the present invention.

FIG. 6 is a circuit diagram illustrating the reading of a right bit of the selected memory cell 310 in the virtual ground memory 300. During a read operation, the voltage applied to a gate terminal of a N-bit memory cell is positive, but typically the voltage amount in a read operation is lower than the voltage amount in a channel hot electron program operation. In this instance, the second word line voltage $V_{WL16}$ 340 is applied with 5 volts, rather than 10 volts as illustrated previously for channel hot electron programming. The voltage amount selected in the second word line voltage $V_{WL16}$ 340 for supplying 5 volts is sufficiently high to turn on the N-bit memory cell 310, but at the same time avoids reaching a voltage level that is near the voltage level for channel hot electron programming.

The N-bit memory cell 310 has the source terminal connected to the second bit line 322 and the drain terminal connected to the third bit line 324. The voltage differential of $V_{BL2}$ 352 and $V_{BL3}$ 350 between the second bit line 322 and the third bit line 324 is also lower relative to the voltage differential for channel hot electron programming. In this embodiment, the $V_{BL2}$ 352 supplies 1.6 volts to the second bit line 322 and $V_{BL3}$ 354 supplies zero volts to the third bit line 324. In one example, the voltage differential between the second bit line 322 and the third bit line 324 is in the range of 1.6 to 1.8 volts.

The read operation in this embodiment of the virtual ground array 300 is a reverse read. A reverse read operation reads an opposite side of an N-bit memory cell from the side in which a higher voltage is applied. The second bit line voltage $V_{BL2}$ 352 supplies the 1.6 volts to the source terminal (i.e., the left side) of the N-bit memory cell 310 such that a right bit 610 of the N-bit memory cell 310 is being read.

Figure 7:
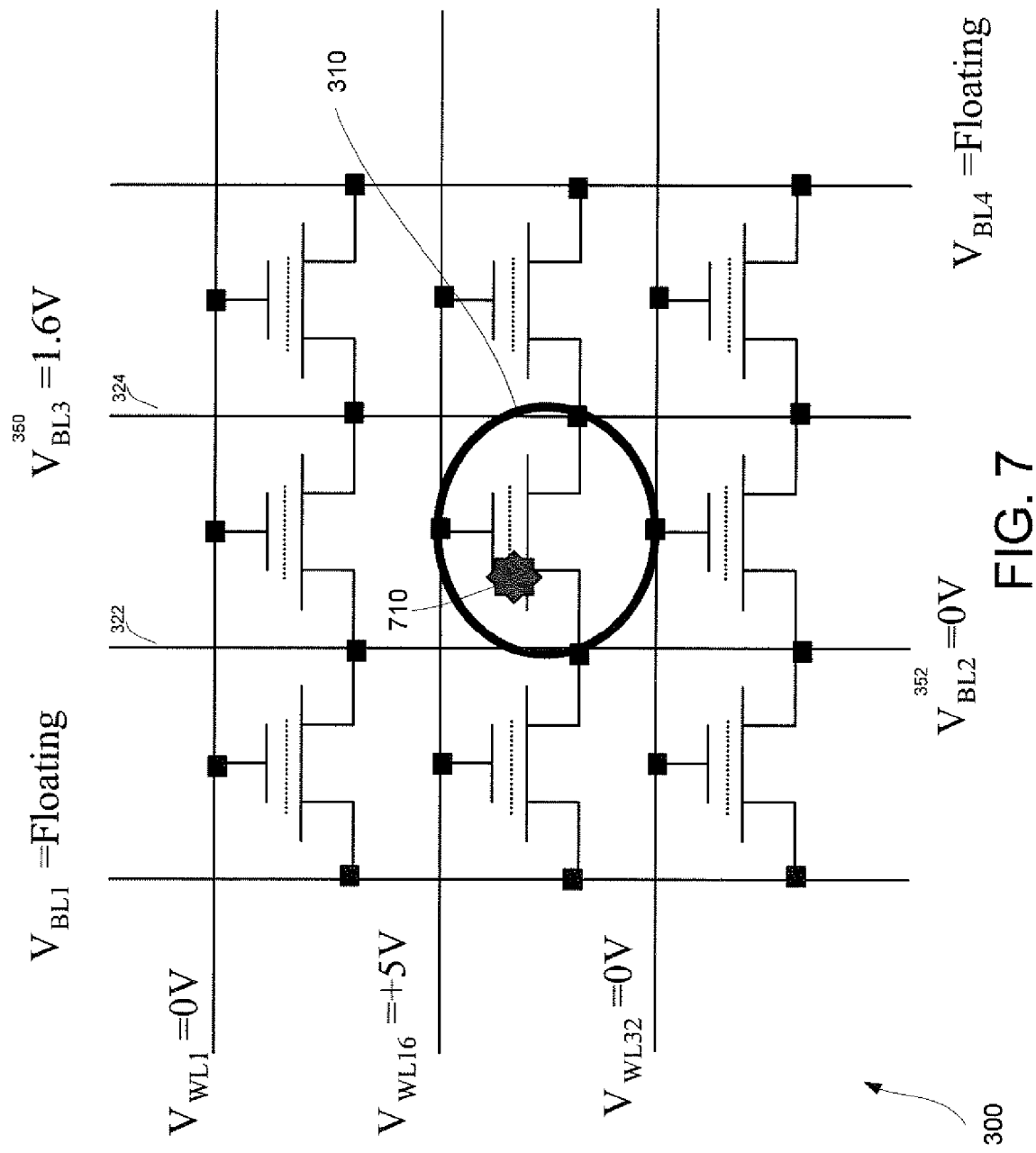
FIG. 7 is a circuit diagram illustrating the reading of a left bit of a selected memory cell in the virtual ground memory in accordance with the present invention.

FIG. 7 is a circuit diagram illustrating the reading of a left bit of a selected memory cell in the virtual ground memory 300. Similar types of properties and conditions apply to the reading of the left bit of the N-bit memory cell 310 as in reading the right bit of the N-bit memory cell 310 as described with respect to FIG. 6. The reverse read condition in reading bit information from the N-bit memory cell 310 dictates that a reading of a left bit 710 requires a higher voltage applies to the drain terminal (i.e., the right side) than the voltage applied to the source terminal (i.e., the left side). In this embodiment, the third bit line $V_{BL3}$ supplies 1.6 volts to the third bit line 324, which is connected to the source terminal of the N-bit memory cell 310, and the second bit line $V_{BL2}$ 352 supplies zero volts to the second bit line 322 of the N-bit memory cell 310.

The invention has been described with reference to specific exemplary embodiments. For example, the charge storage structures in the present invention are applicable to any type or variation of a charge trapping memory including both n-channel and p-channel SONOS types of devices and floating gate memory. Although one programming technique described above refers to a channel hot electron programming, other types of programming techniques can be practiced without departing from the spirits of the present invention. Accordingly, the specification and drawings are to be regarded as illustrative of the principles of this invention rather than restrictive, the invention is defined by the following appended claims.

I claim:

1. A method for operating a memory device comprising a plurality of charge trapping memory cells arranged in an array and coupled to a plurality of bit lines and a plurality of word lines, each charge trapping memory cell comprising source and drain terminals separated by a channel within a substrate and coupled to respective corresponding bit lines in the plurality of bit lines, a dielectric charge trapping structure overlying the channel and having one or more charge trapping sites, and a gate overlying the charge trapping structure and coupled to a corresponding word line in the plurality of word lines, wherein respective source and drain terminals of each charge trapping memory cell define a first pn junction between the source terminal and the substrate and a second pn junction between the drain terminal and the substrate, the method comprising:
   applying a first voltage to the plurality of bit lines and a second voltage to the substrate to reverse bias the first and second pn junctions defined by the source and drain terminals of each charge trapping memory cell in the plurality of charge trapping memory cells; and
   applying a third voltage to the plurality of word lines to attract charge from the substrate to the charge trapping structure of each of the plurality of charge trapping memory cells to change an amount of charge stored in each of the corresponding one or more charge trapping sites.

2. The method of claim 1, wherein the plurality of charge trapping memory cells are arranged in a virtual ground array.

3. The method of claim 1, wherein the applying a third voltage to the plurality of word lines attracts holes from the substrate to the charge trapping structure of each of the plurality of charge trapping memory cells.

4. The method of claim 3, wherein the first voltage is 5 Volts, the second voltage is ground, and the third voltage is −10 Volts.

5. The method of claim 1, wherein the applying a third voltage to the plurality of word lines attracts electrons from the substrate to the charge trapping structure of each of the plurality of charge trapping memory cells.

6. The method of claim 5, wherein the first voltage is 5 Volts, the second voltage is ground, and the third voltage is 10 Volts.

7. The method of claim 1, wherein the charge trapping structure of each of the plurality of charge trapping memory cells comprise:
   a bottom dielectric layer on the corresponding channel;
   a middle dielectric layer on the bottom dielectric layer, the one or more charge trapping sites within the middle dielectric layer; and
   a top dielectric layer on the middle dielectric layer.

8. The method of claim 7, wherein the bottom and top dielectric layers comprises silicon oxide and the middle dielectric layer comprises silicon nitride.

9. The method of claim 1, wherein:
   the substrate comprises p-type doped semiconductor material; and
   the source and drain terminals of each charge trapping memory cell comprise n-type doped semiconductor material.

10. The method of claim 1, wherein the charge trapping structure of each of the plurality of charge trapping memory cells has a first charge trapping site adjacent the corresponding source terminal and a second charge trapping site adjacent the corresponding drain terminal.

* * * * *